US012651631B2

(12) United States Patent
Jain

(10) Patent No.: US 12,651,631 B2
(45) Date of Patent: *Jun. 9, 2026

(54) SYSTEMS AND METHODS FOR IMPROVED DATA ACCESS SPEED

(71) Applicant: Taiwan Semiconductor Manufacturing Company, Ltd., Hsinchu (TW)

(72) Inventor: Sanjeev Kumar Jain, Ottawa (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/503,290

(22) Filed: Nov. 7, 2023

(65) Prior Publication Data

US 2024/0071481 A1 Feb. 29, 2024

Related U.S. Application Data

(63) Continuation of application No. 17/141,279, filed on Jan. 5, 2021, now Pat. No. 11,875,843.

(60) Provisional application No. 63/072,312, filed on Aug. 31, 2020.

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ............................ G11C 11/419; G11C 11/418
USPC ........................................................ 365/154
See application file for complete search history.

(56) References Cited

U.S. PATENT DOCUMENTS

| | | | | |
|---|---|---|---|---|
| 5,093,806 | A * | 3/1992 | Tran ...................... | G11C 11/419 |
| | | | | 365/189.11 |
| 6,344,760 | B1 | 2/2002 | Pyo | |
| 8,289,795 | B1 | 10/2012 | Hsu | |
| 2002/0081789 | A1 | 6/2002 | Kim et al. | |
| 2002/0181301 | A1 | 12/2002 | Takahashi et al. | |
| 2007/0183234 | A1 | 8/2007 | Han et al. | |
| 2008/0162986 | A1* | 7/2008 | Kim ...................... | G11C 29/38 |
| | | | | 714/5.11 |
| 2008/0247249 | A1 | 10/2008 | Lee | |
| 2009/0240900 | A1* | 9/2009 | Sosogi ..................... | G11C 8/12 |
| | | | | 711/155 |

(Continued)

OTHER PUBLICATIONS

Chinese Office Action; Application No. 202110903593.2; Dated Nov. 28, 2023.

(Continued)

*Primary Examiner* — Sung Il Cho
(74) *Attorney, Agent, or Firm* — Jones Day

(57) ABSTRACT

Systems and methods are provided for a memory device. A memory device includes a memory array, a column selection circuit coupled to the memory array, where the column selection circuit is configured to generate a column selection signal, and a sense amplifier configured to receive data signals from the memory array. An enable signal generating circuit is configured to generate a first enable signal and a second enable signal. The column selection circuit generates the column selection signal based on the first enable signal, and the sense amplifier is configured to receive a data signal from the memory array in response to the second enable signal.

20 Claims, 10 Drawing Sheets

(56) References Cited

U.S. PATENT DOCUMENTS

| | | | |
|---|---|---|---|
| 2011/0085391 A1* | 4/2011 | Chandra | G11C 7/02 |
| | | | 365/210.1 |
| 2011/0317478 A1* | 12/2011 | Chan | G11C 29/1201 |
| | | | 365/156 |
| 2012/0127782 A1 | 5/2012 | Moriwaki | |
| 2013/0111282 A1 | 5/2013 | Clark et al. | |
| 2017/0221538 A1* | 8/2017 | Kim | G11C 11/1675 |
| 2018/0158513 A1* | 6/2018 | Tanaka | G11C 11/412 |
| 2018/0233192 A1 | 8/2018 | Won et al. | |
| 2021/0193195 A1* | 6/2021 | Thyagarajan | G11C 7/08 |

OTHER PUBLICATIONS

Taiwan Office Action, Application No. 110130646, Dated Sep. 8, 2022.
Taiwan Notice of Allowance; Application No. 110130646, Dated Oct. 12, 2023.

\* cited by examiner

200

MEMORY CELL CIRCUITRY 204 enable signal generating circuirt

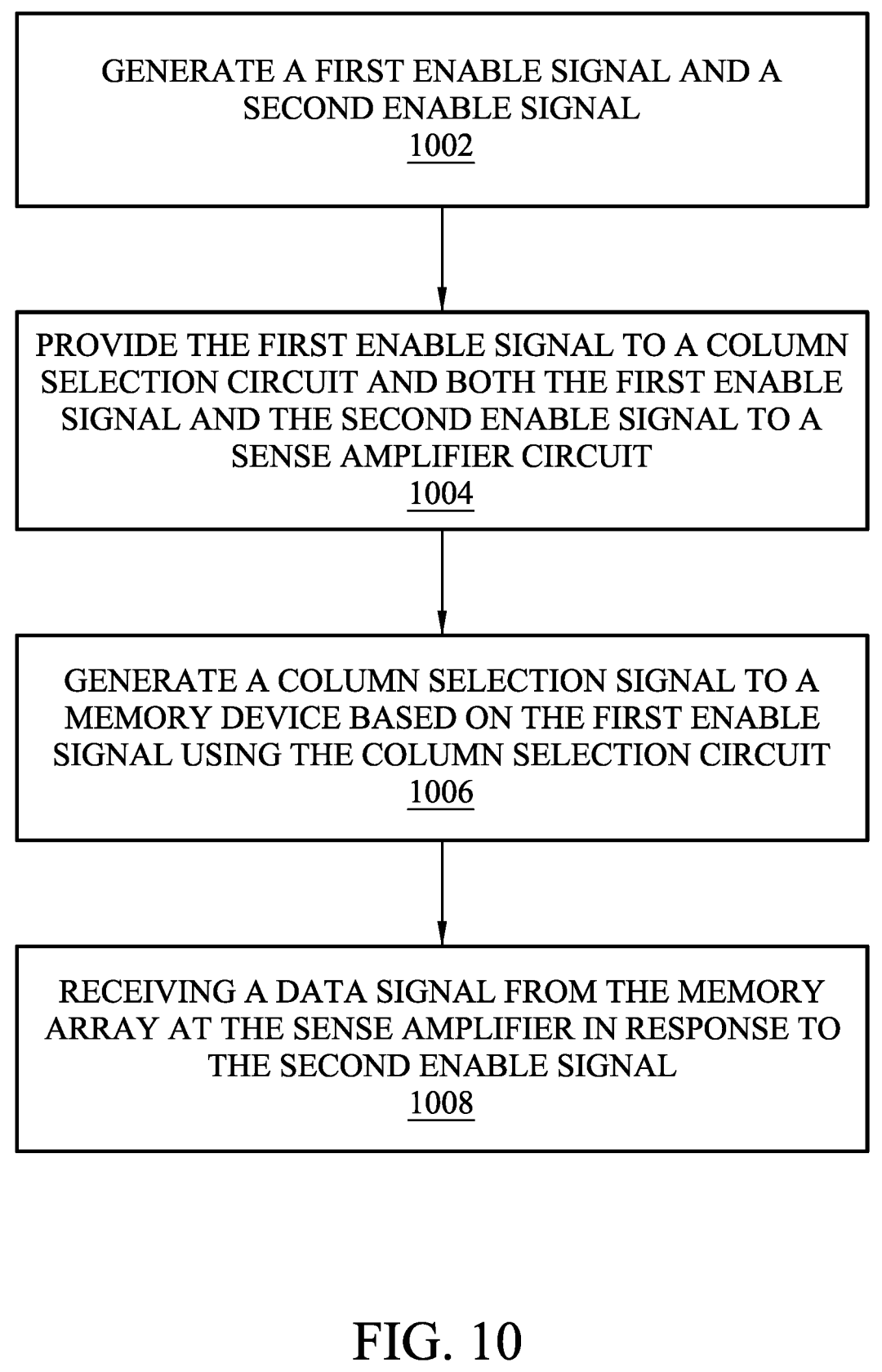

GENERATE A FIRST ENABLE SIGNAL AND A
SECOND ENABLE SIGNAL
1002

PROVIDE THE FIRST ENABLE SIGNAL TO A COLUMN
SELECTION CIRCUIT AND BOTH THE FIRST ENABLE
SIGNAL AND THE SECOND ENABLE SIGNAL TO A
SENSE AMPLIFIER CIRCUIT
1004

GENERATE A COLUMN SELECTION SIGNAL TO A
MEMORY DEVICE BASED ON THE FIRST ENABLE
SIGNAL USING THE COLUMN SELECTION CIRCUIT
1006

RECEIVING A DATA SIGNAL FROM THE MEMORY
ARRAY AT THE SENSE AMPLIFIER IN RESPONSE TO
THE SECOND ENABLE SIGNAL
1008

FIG. 10

SYSTEMS AND METHODS FOR IMPROVED DATA ACCESS SPEED

CROSS-REFERENCE TO RELATED APPLICATIONS

This application is a continuation of U.S. patent application Ser. No. 17/141,279, filed Jan. 5, 2021, entitled "Systems and Methods for Improved Data Access Speed," which claims priority to U.S. Provisional Application No. 63/072,312, filed Aug. 31, 2020, entitled "High Speed Memory Device," each of which is incorporated herein by reference in their entirety.

TECHNICAL FIELD

This disclosure is related to data access and particularly signal timing for coordination of access to stored data values.

BACKGROUND

There is a continued drive for faster data rates in a wide variety of computer applications. Data rates may be improved in different manners including improved data access and data transmission. When accessing data from a memory device, there are a variety of portions of the data access process where latency occurs and improvements may be realized.

BRIEF DESCRIPTION OF THE DRAWINGS

Aspects of the present disclosure are best understood from the following detailed description when read with the accompanying figures.

FIG. 10 is a flow diagram depicting a method of operating a memory device in accordance with an embodiment.

DETAILED DESCRIPTION

Figure 1:
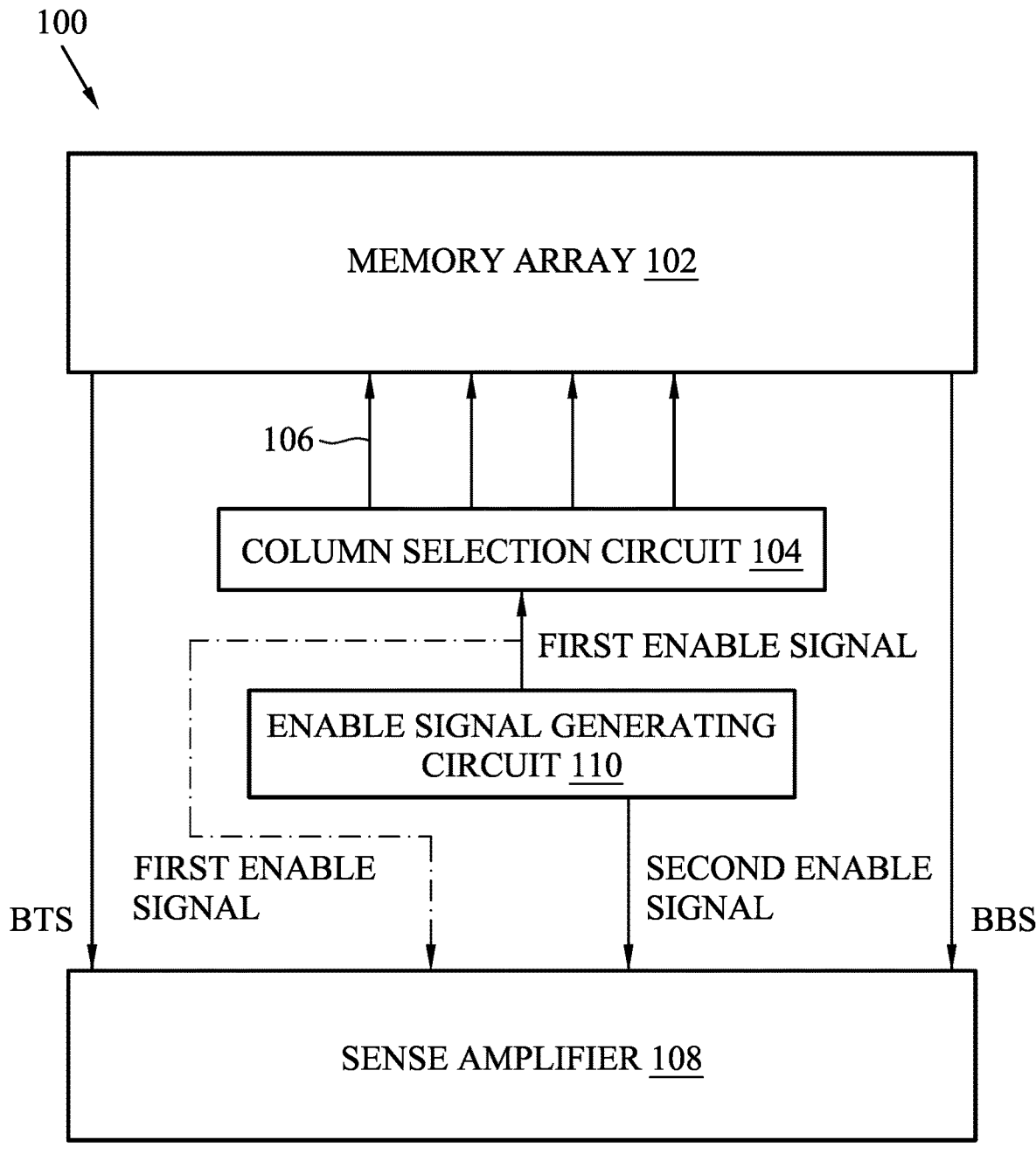
FIG. 1 is a block diagram depicting a memory device in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Computing system performance can often be improved by lessening the time it takes to access data from a data storage device, such as an SRAM memory (e.g., an SRAM register file). Accessing data from a memory may occur in a series of stages. In one example, a clock transition initiates the data access process. An address of the data to be accessed is decoded, and a word line signal is provided to a word line of a memory array based on the address. Data (e.g., a differential data signal on a bit line (BTS) and a bit complement line (BBS)) from one or more columns of the selected word of memory is accessed and provided to a sense amplifier. The sense amplifier senses a difference between signal levels of the received signals and drives one output line (e.g., QT, QB) low and one output line high based on the sensed difference.

Each stage of the data access process is typically associated with some latency. For example, there is a latency associated with decoding a received address that indicates data to be access from the memory array to identify which word line signal to activate. There is also a latency associated with transferring data from an associated data location (i.e., a word/column identified in an address) to the sense amplifier. Systems and methods as described herein can, in embodiments, coordinate selection of data from a column of a selected memory array word and activation of a sense amplifier such that word line-to-sense amplifier latency is minimized.

FIG. 1 is a block diagram depicting a memory device in accordance with an embodiment. The memory device 100 includes a memory array 102 which may be divided into a plurality of rows and columns, where each row/column location includes a memory cell (e.g., a 6T SRAM cell). A column selection circuit 104 is coupled to the memory array and is configured to generate one or more column selection signals 106. A sense amplifier 108 is configured to receive data signals (e.g., on differential signal lines BTS/BBS) from the memory array 102. An enable signal generating circuit 110 coordinates column selection at 104 and sense amplification at 108 by generating a first enable signal and a second enable signal. As described further herein, column selection circuit 104 generates the column selection signal 106 based on the first enable signal, and the sense amplifier 108 receives a data signal from the memory array 102 in response to the second enable signal. In an alternative example embodiment, the sense amplifier 108 further receives the data signal from the memory array 102 based on the first enable signal.

Figure 2:
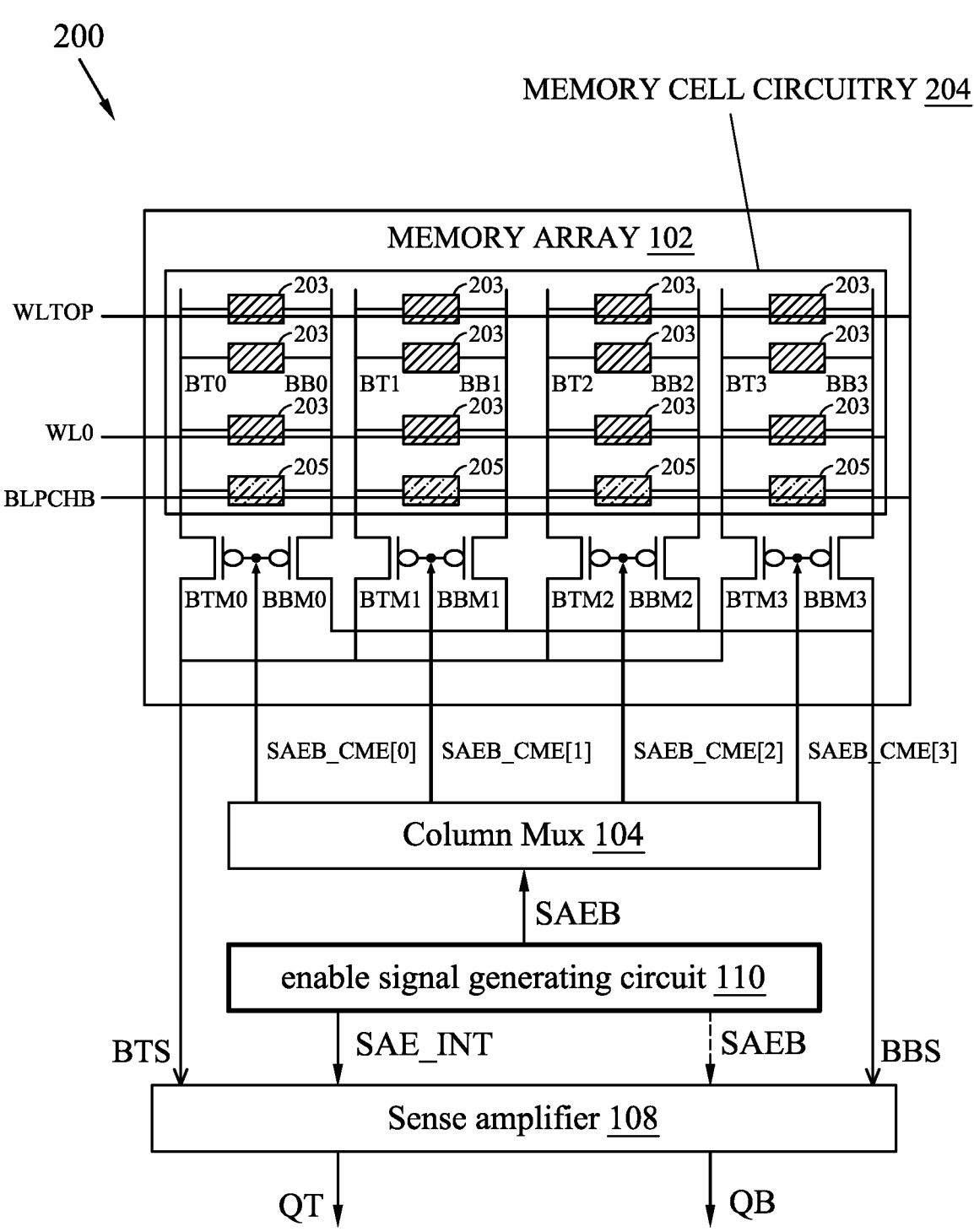
FIG. 2 is a block diagram depicting example details of column selection in accordance with embodiments.

FIG. 2 is a block diagram depicting example details of column selection in accordance with embodiments. FIG. 2 depicts a memory device 200 that includes a memory array 102. The memory array 102 may include memory cell circuitry 204 that includes rows and columns of memory cells 203 (connected to word line signals WLTop . . . WL0) as well as precharge circuits 205 (connected to control signal BLPCHB) for enabling memory cells 203 to promptly output signals representative of data stored within the data cells. In embodiments, the memory device 200 is configured to receive an address of an identified memory cell from which data is to be accessed. The address is decoded and a word line (e.g., WLTop, . . . , WL0) associated with a row where the identified cell resides is asserted (e.g., based on most significant bits of the address). That asserted word line may activate each of the cells in that row such that each cell in the selected row provides respective data signals on BTn, BBn (e.g., a first cell in the selected row provides differential data signals on BT0, BB0, a third cell in the selected row provides differential data signals on BT2, BB2). A column selection circuit 104 (i.e., column multiplexer (MUX)) then selects a column of the memory array (e.g., based on the least significant bits of the address) and forwards data signals from the selected memory cell(s) to a sense amplifier 108 on differential signal lines BTS/BBS. For example, an active low column selection signal on SAEB_CME[0] activates transistors BTM0, BBM0 such that signals received at BT0, BB0 are passed to BTS, BBS as outputs from the memory array 102, respectively. As another example, a low column selection signal on SAEB_CME[2]activates transistors BTM2, BBM2 such that signals received at BT2, BB2 are passed to BTS, BBS as outputs from the memory array 102, respectively. The sense amplifier 108 senses a difference in signal levels of received signals BTS/BBS and outputs a corresponding differential output signal at QT/QB.

The example of FIG. 2 includes an enable signal generating circuit 110. The enable signal generating circuit 110 coordinates column selection by the column selection circuit 104 and activation of the sense amplifier 108 by providing the column selection circuit 104 a first enable signal (SAEB) as described further herein. In embodiments, the enable signal generating circuit 110 further provides a second enable signal (SAE_INT) to the sense amplifier 108, where in embodiments the second enable signal is based on the first enable signal (e.g., the second enable signal is activated a predetermined period of time after the first enable signal is activated as described in further detail herein with respect to FIG. 3, where SAE_INT is activated one inverter transition period after activation of SAEB). In some examples, the enable signal generating circuit also provides the first enable signal (SAEB) to the sense amplifier 108. Coordination of column selection and operation of the sense amplifier can, in embodiments, streamline transmission of data from the memory cells to the sense amplifier, such as by using a reduced number of gating structures (e.g., transistors) on the path between the memory cells and the sense amplifier outputs. For example, in one embodiment, use of the first and second enable signals from the column selection circuit 104 enables direct connection from memory array 102 (see, e.g., BTS, BBS outputs from memory array 102 as depicted in FIG. 2) to input nodes of the sense amplifier 108 (see, e.g., BTS, BTS inputs to as depicted in FIG. 5) without the use of any intervening transistors or logic gates.

Figure 3:
FIG. 3 is a diagram depicting generation of first and second enable signals by an enable signal generating circuit in accordance with embodiments.
Figure 3:
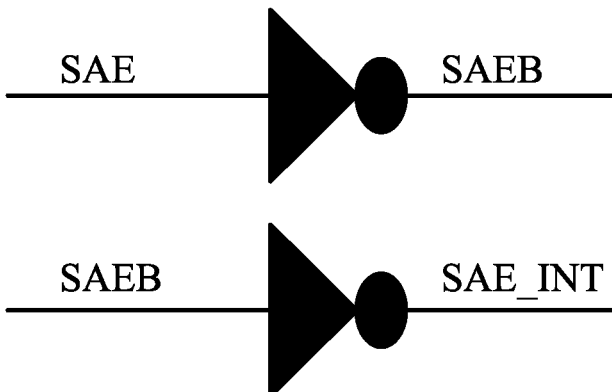

FIG. 3 is a diagram depicting generation of first and second enable signals by an enable signal generating circuit in accordance with embodiments. The enable signal generating circuit receives an input enable signal (SAE), which in embodiments modified to incorporate an enable signal generating circuit and/or other features described herein may be analogous to a sense amplifier enable signal. In the example of FIG. 3, the enable signal generating circuit generates the first enable signal (SAEB) by inverting the input enable signal (SAE) providing an inverted output a predetermined period of time after the input enable signal is received. The enable signal generating circuit further generates the second enable signal (SAE_INT) by inverting the first enable signal (SAEB) providing an inverted output a predetermined period of time after transition of the first enable signal (SAEB).

Figure 4:
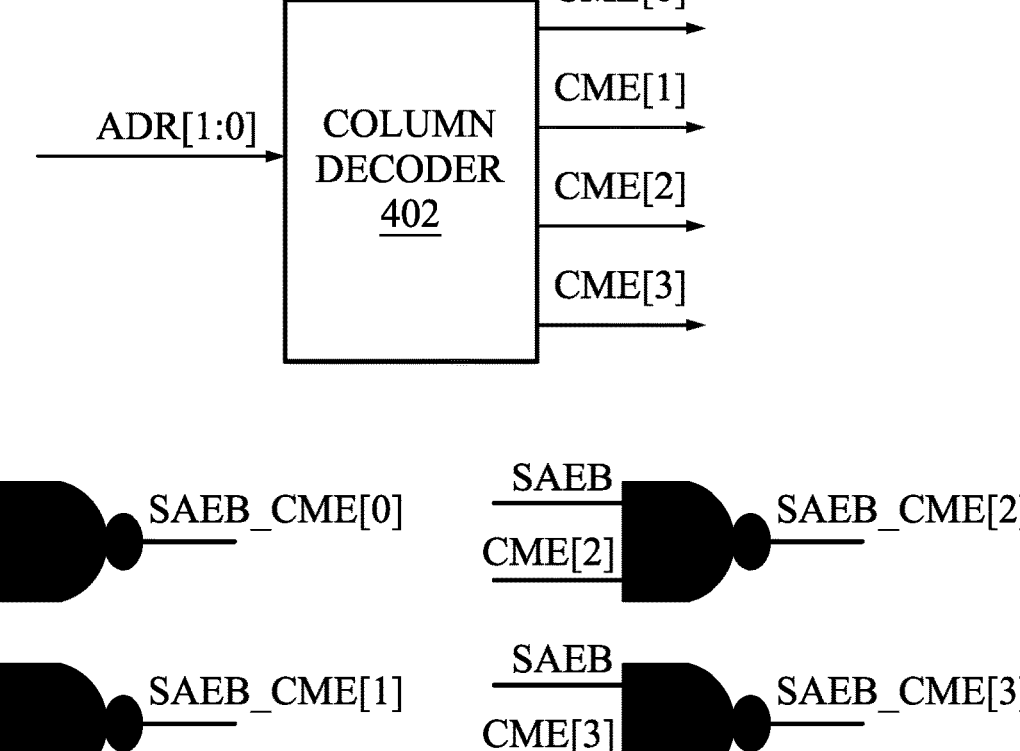
FIG. 4 is a diagram depicting column selection circuitry for generating column selection signals in accordance with embodiments.

FIG. 4 is a diagram depicting column selection circuitry for generating column selection signals 106 in accordance with embodiments. A column selection circuit 104 that is configured to provide an active low column selection signal to one of four columns of a memory array 102 includes four not-and (NAND) gates in an embodiment. The column selection circuit routes the first enable signal (SAEB) from the enable signal generating circuit 110 to each of the NAND gates along with one of four column indication signals CME[0] . . . CME[3], one of which is activated at 402 based on decoding of the two least significant bits of an address of data being accessed. When both the first enable signal (SAEB) and the column indication signal (from 402) received by one of the NAND gates is high, an active low column selection signal is output to the memory array column associated with the indicated column. For example, when the first enable signal SAEB and column indicator CME[0] are high, SAEB_CME[0] (routed to transistors BTM0, BBM0 in the example of FIG. 2) is output active low enabling passage of a data indicating signal from the first column of the memory array 102 to pass to output lines BTS/BBS. As another example, when the first enable signal SAEB and column indicator CME[2] are high, SAEB_CME [2] (routed to transistors BTM2, BBM2 in the example of FIG. 2) is output active low, enabling passage of a data indicating signal from the fourth column of the memory array 102 to pass to output lines BTS/BBS.

Figure 5:
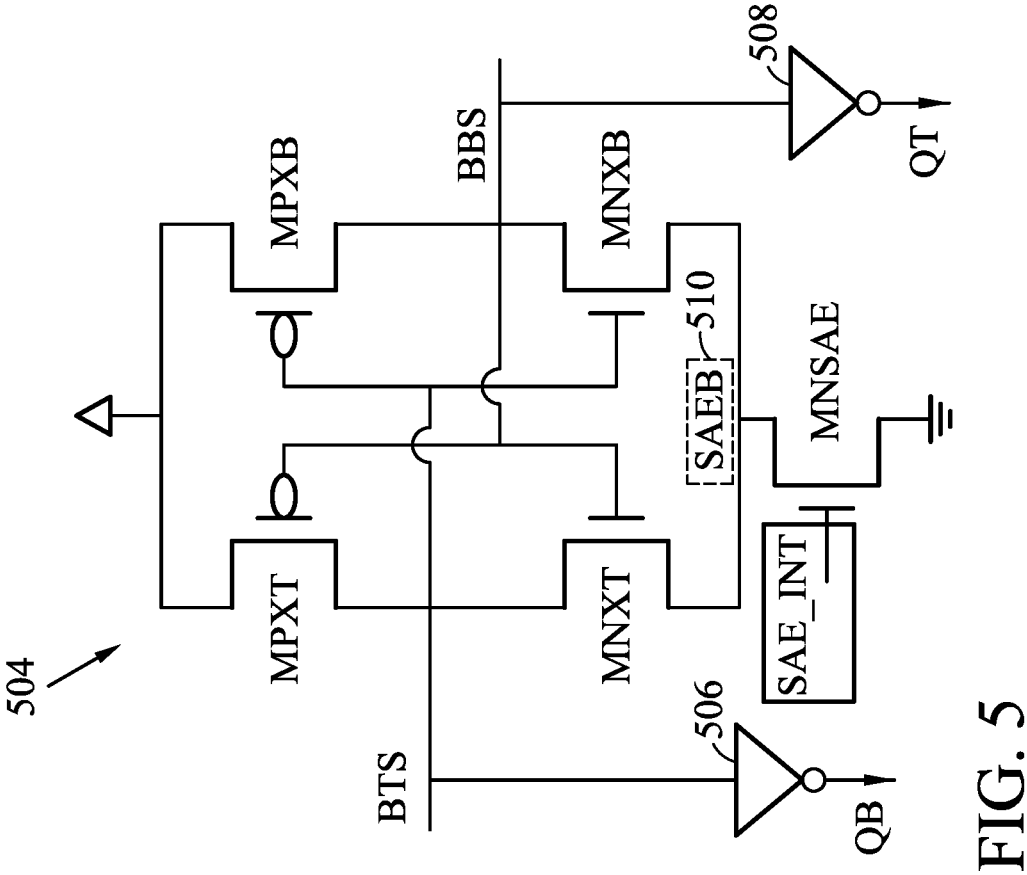
FIG. 5 is a diagram depicting operation of a sense amplifier in accordance with an embodiment.
Figure 5:
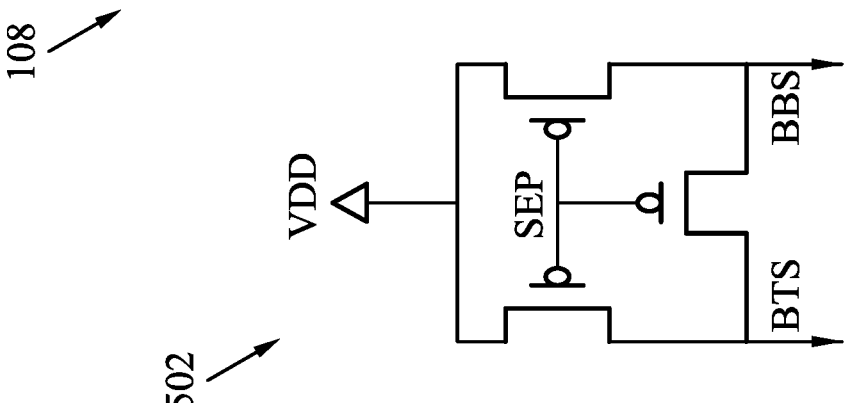

FIG. 5 is a diagram depicting operation of a sense amplifier 108 in accordance with an embodiment. A sense amplifier precharge circuit 502 precharges input nodes BTS/BBS to a high level based on an active low enable circuit SEP, which in embodiments is activated at or about the time that a word line is activated at the memory array 102. A sense amplification portion 504 includes the first input node BTS and the second input node BBS, which receive signals from the memory array. A first inverter 506 is responsive to the first input node BTS and provides a first output QB from the sense amplifier 108. A second inverter 508 is responsive to the second input node BTB and provides a second output QT from the sense amplifier 108.

The sense-amplifying portion 504 further includes circuitry configured to push one of the first and second input nodes (BTS/BBS) high and the other low based on a detected voltage difference between the first and second input nodes. Specifically, the sense amplifying portion 504 includes two P-type transistors (MPXT, MPXB), each connected to a voltage source and an intermediate node) and two N-type transistors (MNXT, MNXB), each connected to a respective one of the intermediate nodes and a sense amplifier transistor (MNSAE), which is further connected to a ground node. The gates of one of the P-type and one of the N-type transistors (MPXB, MNXB) are connected to the first input node BTS; and the gates of one of the P-type and one of the N-type transistors (MPXT, MNXT) are connected to the second input node BBS. The sense amplifying portion 504 in one embodiment is primed for operation by a high first enable signal (SAEB) at 510, followed by a high second enable signal (SAE_INT), which activates the sense amplifier transistor (MNSAE). In other examples, node 510 is not connected to the first enable signal. In operation, input nodes BTS, BBS are initially pre-charged to high levels by precharge circuit 502. Data signals are received at the input nodes BTS/BBS from the memory array after activation of the first enable signal (e.g., via a column selection signal from the column selection circuit). The data signals received at BTS/BBS pull one of the input nodes lower than the other. Upon activation of the sense amplifier transistor (MNSAE) by the second enable signal (SAE_INT), the sense amplifying portion 504 drives whichever input node BTS/BBS is currently at a lower level to the ground level while at the same time driving the other input node to a high level. Inverters 506, 508 invert the resulting signals at the input nodes BTS/BBS, producing corresponding outputs at QT, QB.

Figure 6:
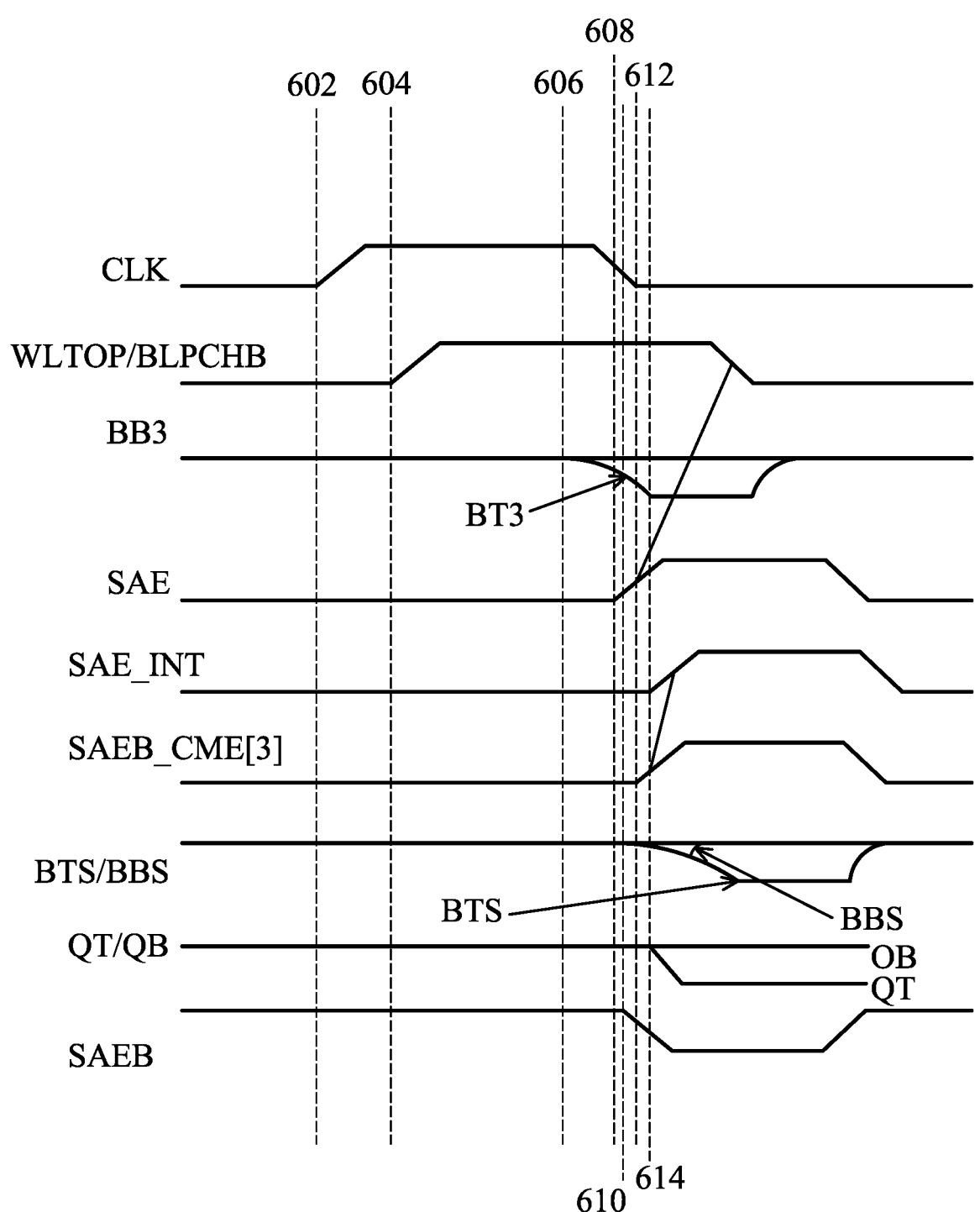
FIG. 6 is a signal diagram depicting operation of a memory device in accordance with an embodiment.

FIG. 6 is a signal diagram depicting operation of a memory device in accordance with an embodiment. In the example of FIG. 6, a data cell in the top row, fourth column is selected. A data access process is initiated at 602 by a rising clock signal, which initiates decoding of the most significant bits of a provided address that dictate which of a plurality of word lines is to be activated. At 604, the word line (WLTOP) identified by the most significant bits of the address and a bit line precharge circuit control signal are activated. Upon receipt of WLTOP, each of the bit cells in the top row drive their respective BTn/BBn signal lines to levels corresponding to the data value stored therein. In this example, because Top Row, Column 4 is selected by the address, signals on BB[2:0], BT[2:0] are Don't Care values and are not indicated in FIG. 6. The data value in Top Row, Column 4 pulls BT3 toward a low value while keeping BB3 near a high level, beginning at 606.

At 608, an input enable signal (SAE) provided to the enable signal generating circuit transitions high. The enable signal generating circuit generates the first enable signal (SAEB) at 610 which is received by the column selection circuit and used to generate column selection signal SAEB_CME[3] at 612 based on the first enable signal and a column indicating signal CME[3] generated based on decoding of the least significant bits of the address. The SAEB_CME[3] signal generated by the column selection circuit selects the fourth column of the top word line of the memory array and initiates transmission of the signal from BT3/BB3 to the sense amplifier via BTS/BBS, respectively. One can see BTS and BBS beginning to transition based on the column selection signal (SAEB_CME[3]) at 612.

The first enable signal (SAEB) may, in embodiments, also provided to the sense amplifier to prime the sense amplifier for operation. The sense amplifier receives the second enable signal (SAE_INT) at 614, which triggers sense amplifier operation. When triggered by the second enable signal (SAE_INT), the sense amplifier senses the difference between BTS and BBS at its input nodes and drives the corresponding one of QT and QB low accordingly at 614.

Figure 7:
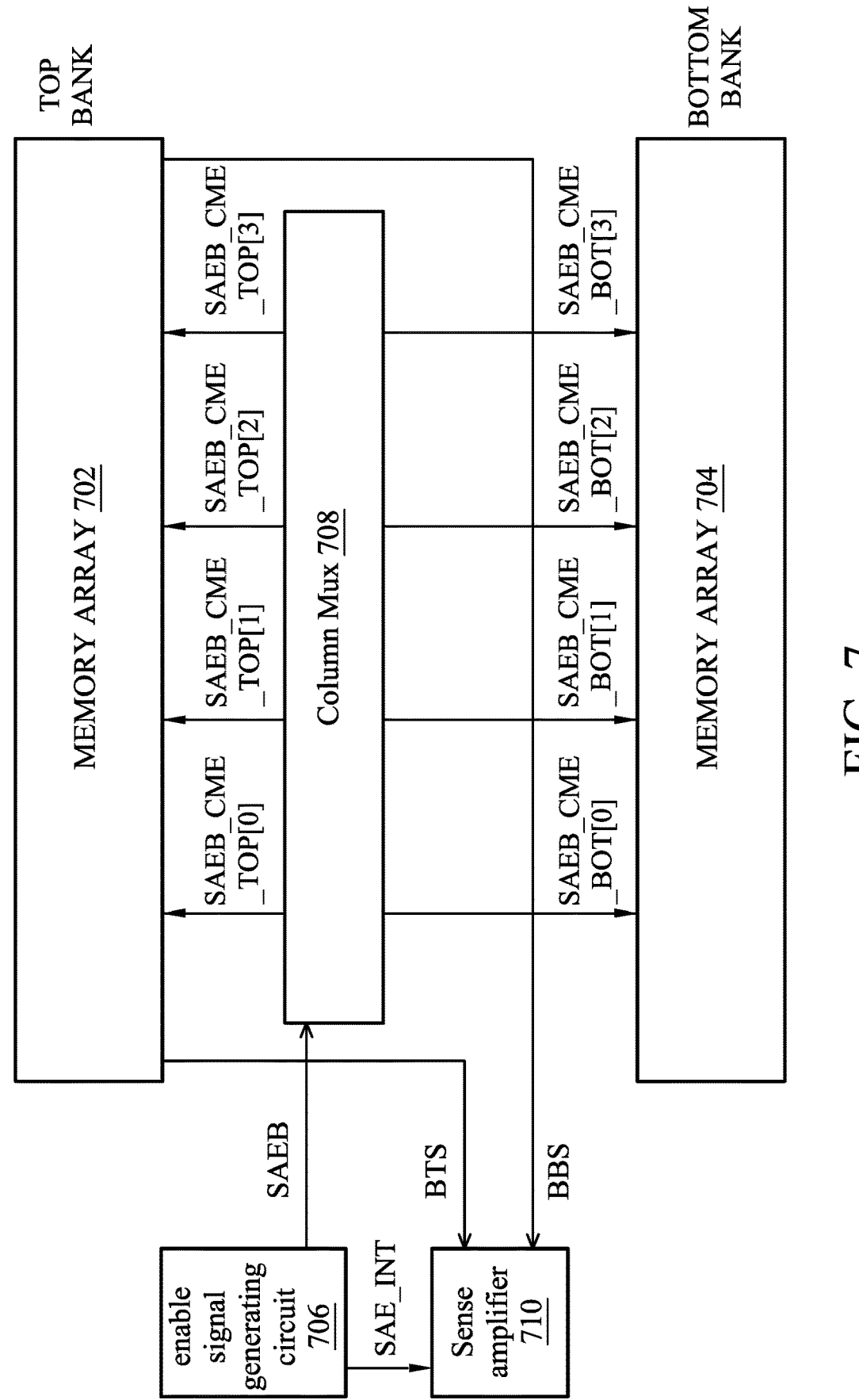
FIG. 7 is a block diagram depicting an enable signal generating circuit operating on a multibank memory device in accordance with an embodiment.

While the preceding examples described column selections among a memory array with four columns, systems and methods as described herein may be applied to a multitude of memory array structures having more or fewer columns as well as multibank structures. FIG. 7 is a block diagram depicting an enable signal generating circuit operating on a multibank memory device in accordance with an embodiment. The memory device of FIG. 7 includes a memory array that is divided into multiple (2) memory banks, a top memory bank 702 and a bottom memory bank 704. Each memory bank 702, 704 includes multiple rows of memory cells, each row containing four columns [columns 0 . . . 3].

An enable signal generating circuit 706 is configured to generate a first enable signal (SAEB) that is provided to a column multiplexer 708 and a second enable signal (SAE_INT) that is provided to a sense amplifier 710. In embodiments, the first enable signal (SAEB) is used by the column multiplexer 708 to select one column from either the top bank 702 or the bottom bank 704 (e.g., based on the two least significant bits of an address and a top/bottom bank indication signal).

Figure 8:
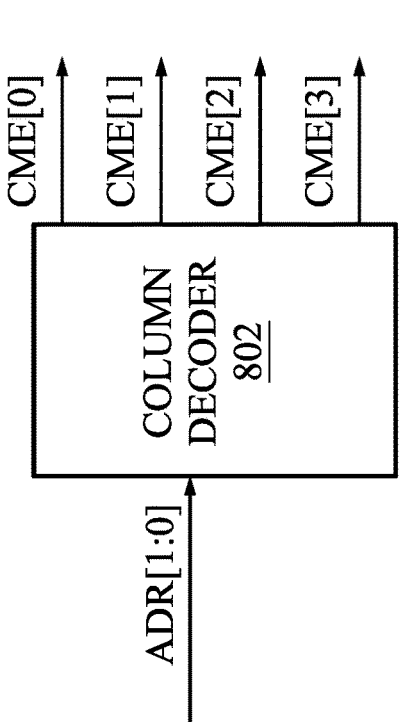
FIG. 8 is a diagram depicting column multiplexer circuitry for selecting a column from one of multiple memory banks in accordance with an embodiment.
Figure 8:
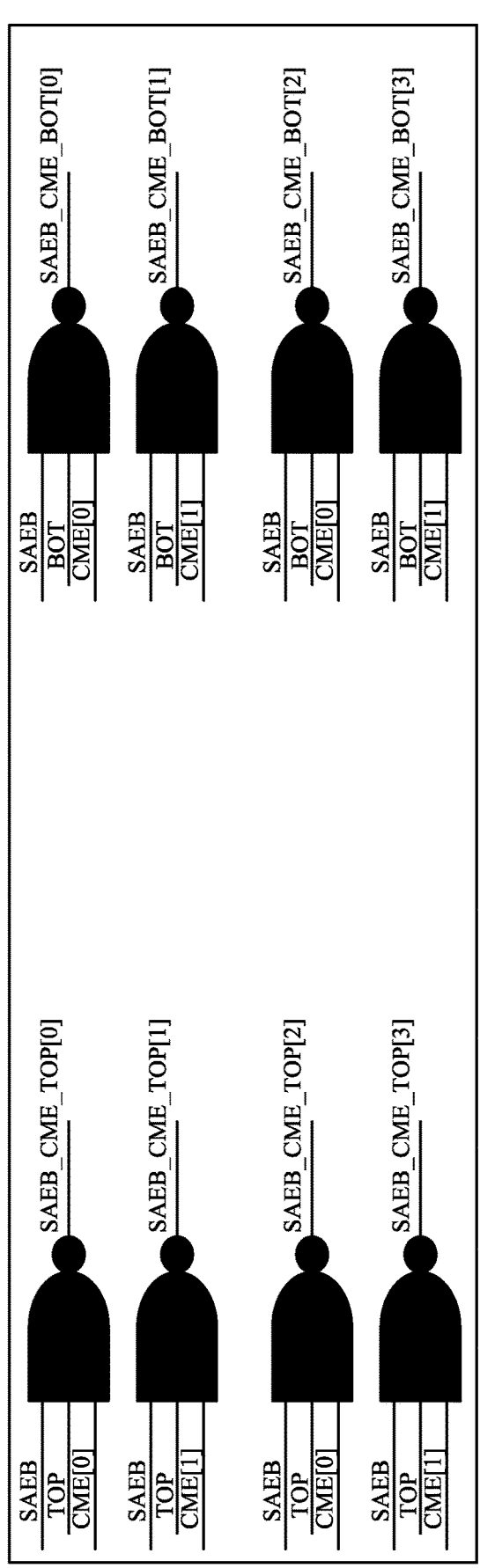

FIG. 8 is a diagram depicting column multiplexer circuitry 708 for selecting a column from one of multiple memory banks 702, 704 in accordance with an embodiment. The column multiplexer 708 receives the two least significant bits of an address (ADR[1:0]) which is decoded at 802 to identify which column should be selected from either the top bank 702 or bottom bank 704 by activating one of CME[0] . . . CME[3] (e.g., similar as performed above with respect to FIG. 4). The column multiplexer 708 further receives a Top/Bottom signal (e.g., on one or separate signal lines). The example column multiplexer 708 of FIG. 8 includes eight NAND gates, each of the NAND gates being associated with one of the columns of the two-bank memory (i.e., columns 0 . . . 3 of the top memory bank and columns 0 . . . 3 of the bottom memory bank). The number of NAND gates is configurable and may change depending on the number of columns in the memory banks and the number of memory banks served by the column multiplexer 708 (e.g., y-NAND gates=n-columns-per-memory-bank*m-memory-banks). Upon receipt of a signal from the column decoder 802 and the top/bottom indication signal that indicates that the NAND gate is associated with the requested column/memory bank, and upon receipt of the first enable signal (SAEB), the NAND gate is configured to assert a corresponding column selection signal SAEB_CME_TOP(or BOT)_[0 . . . 3]. Upon receipt of a column selection signal, the selected column of the selected memory bank provides a data-indicating signal on output lines BTS, BBS.

With reference back to FIG. 7, the enable signal generating circuit 706 is further configured to provide the second enable signal (SAE_INT) to the sense amplifier 710. The sense amplification operation is initiated on receipt of the second enable signal (SAE_INT), whereby data signals are output from the memory circuit based on that sense amplification.

Figure 9:
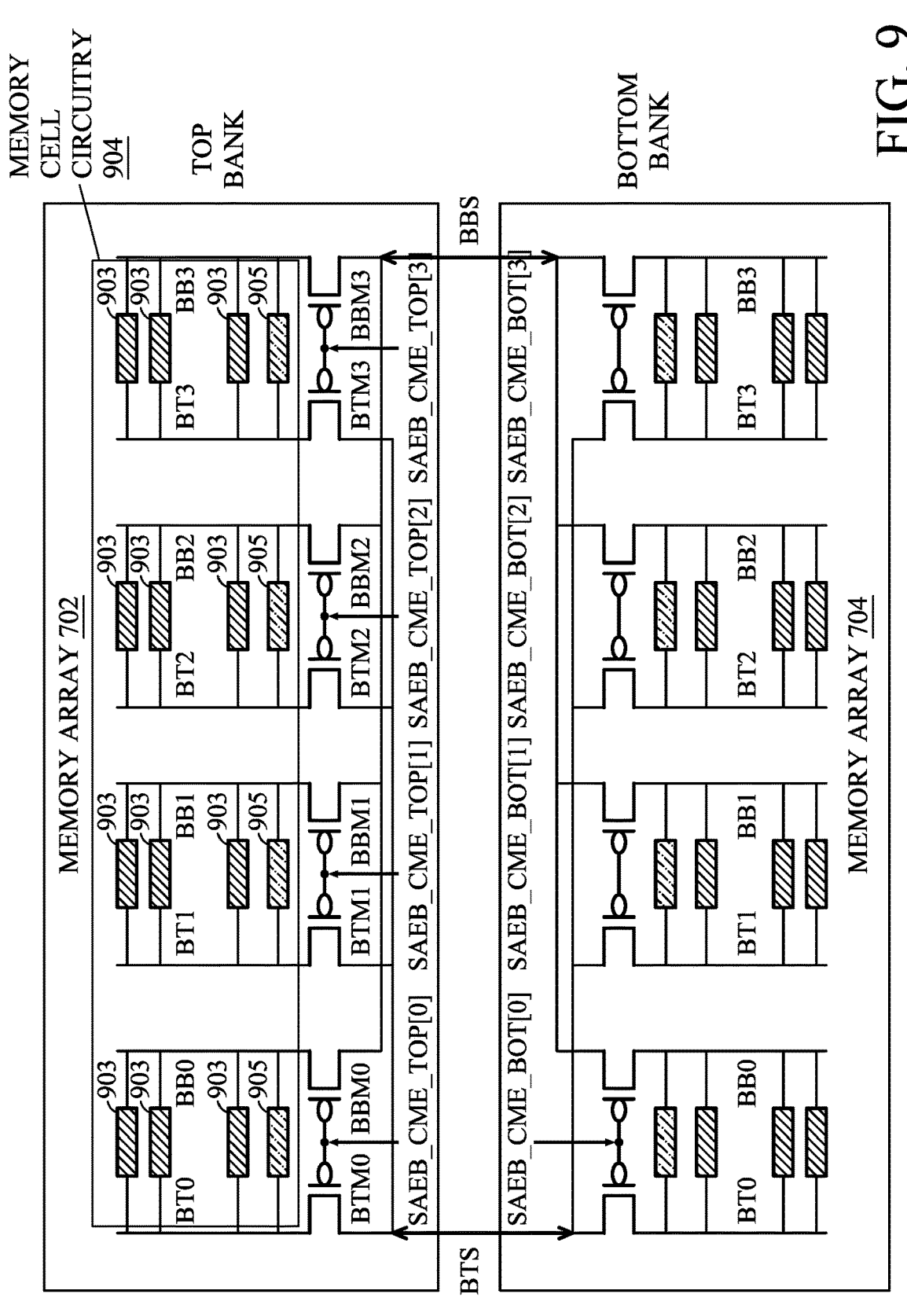
FIG. 9 is a diagram depicting a multi-bank memory device circuit in accordance with an embodiment.

FIG. 9 is a diagram depicting a multi-bank memory device circuit in accordance with an embodiment. FIG. 9 depicts a memory device 900 that includes a top array 702. The top memory array 702 may include memory cell circuitry 904 that includes rows and columns of memory cells 903 as well as precharge circuits 905 for enabling memory cells 903 to promptly output signals representative of data stored within the data cells. A bottom memory array 704 is similarly structured.

In embodiments, the memory device 900 is configured to receive an address of an identified memory cell/memory bank from which data is to be accessed. The address is decoded and a word line associated with a row where the identified cell resides is asserted (e.g., based on most significant bits of the address). In embodiments a word line in both the top and bottom memory arrays 702, 704 may be activated. In other examples only one word line across the two memory arrays 702, 704 may be asserted. That asserted word line may activate each of the cells in that row such that each cell in the selected row provides respective data signals on BTn, BBn. A column selection circuit (e.g., column MUX 708 of FIG. 7) then selects a column and bank of the memory array (e.g., based on the least significant bits of the address and a top/bottom bank indication signal as illustrated in FIG. 8) by activating one of SAEB_CME_TOP[0] . . . SAEB_CME_BOT[3] and forwards data signals from the selected memory cell(s) to a sense amplifier on differential signal lines BTS/BBS.

FIG. 10 is a flow diagram depicting a method of operating a memory device in accordance with an embodiment. While the steps of the method may be performed using a wide variety of structures, references to some example structures are provided here for clarity. The method uses an enable signal circuit 110 to generate a first enable signal and a second enable signal at 1002. At 1004, first enable signal is provided to a column selection circuit 104, and the second enable signal is provided to a sense amplifier circuit 108. The column selection circuit 104 is used at 1006 to generate a column selection signal 106 to a memory device 102 based upon the first enable signal. At 1008, a data signal is received from the memory array 102 at the sense amplifier 108 in response to the second enable signal.

Use of the various processes as described herein can provide a number of advantages. For example, use of the subject matter can provide high speed clock access to data stored in a memory, such as an SRAM register file. By coordinating selection of a column of memory and sense amplifier operation, in embodiments, data signals can be transmitted from a memory array to a sense amplifier directly, or substantially directly, with limited circuitry (e.g., transistors or logic gates) therebetween.

In one example, a memory device includes a memory array, a column selection circuit coupled to the memory array, where the column selection circuit is configured to generate a column selection signal, and a sense amplifier configured to receive data signals from the memory array. An enable signal generating circuit is configured to generate a first enable signal and a second enable signal. The column selection circuit generates the column selection signal based on the first enable signal, and the sense amplifier is configured to receive a data signal from the memory array in response to the second enable signal.

In another example a method of operating a memory device uses an enable signal circuit to generate a first enable signal and a second enable signal. The first enable signal is provided to a column selection circuit, and the second enable signal to a sense amplifier circuit. The column selection circuit is used to generate a column selection signal to a memory device based upon the first enable signal. A data signal is received from the memory array at the sense amplifier in response to the second enable signal.

In a further embodiment, an enable signal generator includes an input configured to receive an input enable signal. Logic is present for generating a first enable signal based on the input enable signal, said first enable signal being routed to a memory array column selection circuit. And further logic is present for generating a second enable signal based on the input enable signal, said second enable signal being routed to a sense amplifier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A device comprising:
    a column selection circuit configured to be coupled to a memory array;
    a sense amplifier; and
    an enable signal generating circuit configured to receive an input enable signal and to generate a first enable signal, and a second enable signal based on the first enable signal via an inverter, wherein:

the column selection circuit is configured to generate a column selection signal based on the first enable signal;
the sense amplifier is configured to receive a data signal from the memory array in response to the first enable signal and the second enable signal;
column selection by the column selection circuit and receipt of the data signal by the sense amplifier are both performed after receiving the first enable signal; and
the sense amplifier includes a sense amplifier pull down transistor with a source/drain terminal receiving the first enable signal.

2. The device of claim 1, further comprising the memory array.

3. The device of claim 2, wherein the memory array includes a row selected based on a word line signal and data of a selected row is output based on the column selection signal.

4. The device of claim 2, wherein:
    the memory array comprises a top memory bank and a bottom memory bank; and
    the column selection signal is based further on an address signal and a bank selection signal.

5. The device of claim 1, wherein the column selection circuit is configured to generate the column selection signal based further on an address.

6. The device of claim 1, wherein the column selection circuit is configured to generate the column selection signal based further on least significant bits of an address.

7. The device of claim 1, wherein the sense amplifier comprises:
    a first inverter responsive to a first memory array input signal at a first input node and configured to provide a first output; and
    a second inverter responsive to a second memory array input signal at a second input node and configured to provide a second output.

8. The device of claim 7, wherein the sense amplifier is configured to push one of the first and second input nodes high and the other low based on a detected voltage difference between the first and second input nodes.

9. The device of claim 8, wherein the circuit is further configured to detect a voltage difference based on the first and second enable signals.

10. The device of claim 7, wherein:
    the first input node is configured to receive the first memory array input signal from the memory array; and
    the second input node is configured to receive the second memory array input signal from the memory array.

11. The device of claim 1, wherein the column selection circuit includes a logic gate configured to receive the first enable signal at a first input thereof and an address at a second input thereof and to generate the column selection signal at an output thereof.

12. The device of claim 11, wherein the logic gate is a NAND gate.

13. The device of claim 1, wherein:
    the sense amplifier pull down transistor has the other source/drain terminal coupled to ground, and a gate terminal configured to receive the second enable signal.

14. A method of operating a device, the method comprising:
    receiving an input enable signal and generating a first enable signal;
    receiving the first enable signal and generating a second enable signal;
    providing the first enable signal and the second enable signal to a sense amplifier, wherein the first enable signal is provided to a source/drain terminal of a sense amplifier pull down transistor in the sense amplifier;

receiving a data signal at the sense amplifier after receiving the first enable signal; and generating a column selection signal based on the first enable signal.

15. The method of claim 14, further comprising generating the column selection signal further based on an address signal.

16. The method of claim 15, further comprising:

selecting a row of a memory array based on a word line signal; and outputting data from the selected row based on the column selection signal.

17. The method of claim 16, wherein:

the memory array comprises a top memory bank and a bottom memory bank; and the column selection signal is generated based further on a bank selection signal.

18. The method of claim 14, further comprising:

receiving a first memory array input signal at a first input node of the sense amplifier, wherein a first inverter is positioned between the first input node and a first sense amplifier output;

receiving a second memory array input signal at a second input node of the sense amplifier, wherein a second inverter is positioned between the second input node and a second sense amplifier output; and operating a circuit configured to push one of the first and second input nodes high and the other low based on a detected voltage difference between the first and second input nodes.

19. The method of claim 14, wherein the circuitry is configured to detect a voltage difference based on the first and second enable signals.

20. An enable signal generator comprising:

a first logic gate configured to generate a first enable signal based on an input enable signal; and a second logic gate configured to receive the first enable signal and to generate a second enable signal, wherein the first and second logic gates are identical logic gates and the first and second enable signals are directly taken as inputs by a sense amplifier.

\* \* \* \* \*